US012620422B2

(12) United States Patent
Shang et al.

(10) Patent No.: US 12,620,422 B2
(45) Date of Patent: May 5, 2026

(54) DATA STORAGE CIRCUIT AND CONTROL METHOD THEREOF, AND STORAGE APPARATUS

(71) Applicant: CHANGXIN MEMORY TECHNOLOGIES, INC., Hefei (CN)

(72) Inventors: Weibing Shang, Hefei (CN); Hongwen Li, Hefei (CN); Liang Chen, Hefei (CN); Fengqin Zhang, Hefei (CN); Wei Jiang, Hefei (CN); Li Tang, Hefei (CN); Chia-Chi Hsu, Hefei (CN); Han-Sih Ou, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 105 days.

(21) Appl. No.: 18/155,084

(22) Filed: Jan. 17, 2023

(65) Prior Publication Data

US 2023/0178119 A1 Jun. 8, 2023

Related U.S. Application Data

(63) Continuation of application No. PCT/CN2022/099828, filed on Jun. 20, 2022.

(30) Foreign Application Priority Data

Jul. 7, 2021 (CN) .......................... 202110768497.1

(51) Int. Cl.
*G11C 7/08* (2006.01)

(52) U.S. Cl.
CPC .......... *G11C 7/08* (2013.01); *G11C 2207/061* (2013.01)

(58) Field of Classification Search
CPC ............................ G11C 7/08; G11C 2207/061
(Continued)

(56) References Cited

U.S. PATENT DOCUMENTS 6,081,458 A 6/2000 Lattimore et al.
6,327,202 B1 * 12/2001 Roohparvar ........... G11C 16/24
365/207

(Continued)

FOREIGN PATENT DOCUMENTS

CN 1124610 C 10/2003
CN 101064186 A 10/2007
CN 110619903 A 12/2019

OTHER PUBLICATIONS

First Office Action and Search Report dated Feb. 25, 2026, issued in Chinese Patent Application No. 202110768497.1, with English machine translation (15 pages).

*Primary Examiner* — Sung Il Cho
(74) *Attorney, Agent, or Firm* — Sheppard Mullin Richter & Hampton LLP

(57) ABSTRACT

Embodiments relate to a data storage circuit and a control method thereof, and a storage apparatus. The data storage circuit includes a first storage array and a sense amplifier array, the first storage array is positioned on a side of the sense amplifier array, and the sense amplifier array is electrically connected to a main bit line. The first storage array includes a plurality of first sub storage arrays, each of the plurality of first sub storage arrays includes a plurality of first sub bit lines and a plurality of first selector switches, each of the plurality of first sub bit lines is electrically connected to the main bit line via one of the plurality of first selector switches, and the sense amplifier array is configured to amplify a signal of the main bit line.

18 Claims, 6 Drawing Sheets

(58) Field of Classification Search
USPC ......................................................... 365/207
See application file for complete search history.

(56)                    References Cited

U.S. PATENT DOCUMENTS

| | | | |
|---|---|---|---|
| 7,310,257 B2 * | 12/2007 | Manning ............. | G11C 11/4094 |
| | | | 365/205 |
| 9,099,169 B1 | 8/2015 | Morton | |
| 2005/0213404 A1 * | 9/2005 | Kodama ................. | G11C 7/12 |
| | | | 365/203 |
| 2007/0103955 A1 | 5/2007 | Manning et al. | |
| 2011/0026292 A1 | 2/2011 | Narui | |
| 2011/0069570 A1 * | 3/2011 | Katoch ................. | G11C 7/062 |
| | | | 365/207 |
| 2012/0230141 A1 | 9/2012 | Mochida | |
| 2013/0016576 A1 * | 1/2013 | O'Connell .......... | G11C 11/4091 |
| | | | 365/207 |
| 2013/0039120 A1 * | 2/2013 | Moriwaki ............. | G11C 11/419 |
| | | | 365/154 |
| 2013/0051163 A1 * | 2/2013 | Koike ................. | G11C 29/026 |
| | | | 365/207 |
| 2019/0287606 A1 | 9/2019 | Dozaka | |

* cited by examiner

200

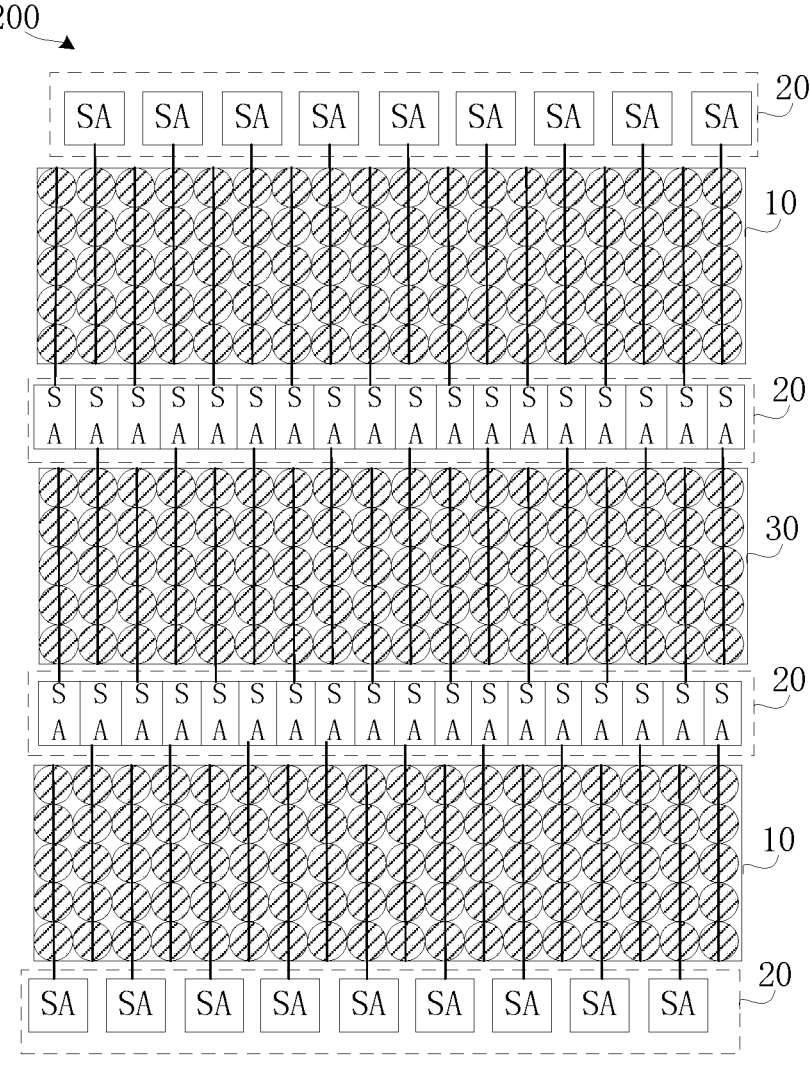

Control a given one of the plurality of first selector switches corresponding to a selected one of the plurality of first sub storage arrays to be turned on to electrically connect the plurality of first sub bit lines and the main bit line, and control a given one of the plurality of first selector switches corresponding to an unselected one of the plurality of first sub storage arrays to be turned off

204

Control the sense amplifier array to be in an amplification stage to amplify a signal of the main bit line, where a start moment of the amplification stage is later than a start moment of turn-on of the given first selector switch

Fig. 7

DATA STORAGE CIRCUIT AND CONTROL METHOD THEREOF, AND STORAGE APPARATUS

CROSS-REFERENCE TO RELATED APPLICATION

The present disclosure is a continuation of PCT/CN2022/099828, filed on Jun. 20, 2022, which claims priority to Chinese Patent Application No. 202110768497.1 titled "DATA STORAGE CIRCUIT AND CONTROL METHOD THEREOF, AND STORAGE APPARATUS" and filed to the State Patent Intellectual Property Office on Jul. 7, 2021, the entire contents of which are incorporated herein by reference.

TECHNICAL FIELD

The present disclosure relates to the field of semiconductor storage technology, and more particularly, to a data storage circuit and a control method thereof, and a storage apparatus.

BACKGROUND

In general, a semiconductor storage apparatus is arranged in a large two-dimensional array including memory cells. Each row of memory cells may be selected by means of word lines, and each column of memory cells may be selected by means of bit lines. Memory cells positioned at intersections between the word lines and the bit lines are configured to store corresponding data. Sense amplifiers can accurately determine data stored in the memory cells, and are widely used in various storage apparatuses to read the data stored in the memory cells.

However, with continuous improvement of storage capacity of a semiconductor storage apparatus in the market, number of memory cells distributed in the semiconductor storage apparatus and number of correspondingly demanded sense amplifiers are constantly increased, resulting in increasing dimension, energy consumption and production costs of the semiconductor storage apparatus.

Therefore, how to reduce the dimension, the energy consumption and the production costs of the semiconductor storage apparatus without reducing the storage capacity of the semiconductor storage apparatus becomes one of technical problems to be solved urgently.

SUMMARY

According to various embodiments of the present disclosure, there are provided a data storage circuit and a control method thereof, and a storage apparatus.

According to some embodiments, in one aspect the present disclosure provides a data storage circuit, which includes a first storage array and a sense amplifier array, where the first storage array is positioned on a side of the sense amplifier array, and the sense amplifier array is electrically connected to a main bit line. The first storage array includes a plurality of first sub storage arrays, each of the plurality of first sub storage arrays includes a plurality of first sub bit lines and a plurality of first selector switches, each of the plurality of first sub bit lines is electrically connected to the main bit line via one of the plurality of first selector switches, and the sense amplifier array is configured to amplify a signal of the main bit line.

According to some embodiments, the plurality of first sub storage arrays are arranged at equal intervals along a direction away from the sense amplifier array.

According to some embodiments, each of the plurality of first sub storage arrays has equal number of first sub bit lines.

According to some embodiments, each of the plurality of first sub storage arrays includes a plurality of word lines, and each of the plurality of first sub storage arrays has equal number of word lines.

According to some embodiments, the plurality of first sub bit lines are further electrically connected to a preset equalization voltage via a first equalizer switch.

According to some embodiments, the first equalizer switch is configured to enable a start moment of turn-off earlier, by first preset time, than a start moment of turn-on of the plurality of first selector switches corresponding to a selected one of the plurality of first sub storage arrays.

According to some embodiments, the data storage circuit further includes a second storage array, which is positioned on a side of the sense amplifier array away from the first storage array.

According to some embodiments, the second storage array includes a plurality of second sub storage arrays, the plurality of second sub storage arrays have equal number as the plurality of first sub storage arrays, and each of the plurality of second sub storage arrays includes a plurality of second sub bit lines.

According to some embodiments, the sense amplifier array is further electrically connected to a complementary main bit line, and the plurality of second sub bit lines are electrically connected to the complementary main bit line via second selector switches.

According to some embodiments, each of the plurality of second sub storage arrays is configured to: when a corresponding one of the plurality of first sub storage arrays is selected, control a corresponding one of the second selector switches to act following a given one of the plurality of first selector switches corresponding to the selected first sub storage array; and otherwise, control a given one of the second selector switches corresponding to an unselected one of the plurality of second sub storage arrays to be turned off.

According to some embodiments, each of the first storage arrays is configured to: when a corresponding one of the plurality of first sub storage arrays is selected, control a given one of the plurality of first selector switches corresponding to the selected first sub storage array to be turned on to electrically connect the plurality of first sub bit lines and the main bit line; and otherwise, control a given one of the plurality of first selector switches corresponding to an unselected one of the plurality of first sub storage arrays to be turned off.

According to some embodiments, the sense amplifier array is configured to: begin to amplify the signal of the main bit line within second preset time from a start moment of turn-on of the given first selector switch corresponding to the selected first sub storage array, wherein an end moment of an amplification stage is later, by third preset time, than a start moment of turn-off of the given first selector switch corresponding to the selected first sub storage array.

According to some embodiments, the sense amplifier array is configured to: enable an end moment of a precharge stage earlier, by fourth preset time, than the start moment of turn-on of the given first selector switch corresponding to the selected first sub storage array.

According to some embodiments, another aspect of the present disclosure provides a storage apparatus, which includes a plurality of data storage circuits in the embodiments of the present disclosure.

According to some embodiments, another aspect of the present disclosure provides a method for controlling data storage, which is applied to a data storage circuit. The data storage circuit includes a sense amplifier array and a first storage array positioned on a side of the sense amplifier array, where the sense amplifier array is electrically connected to a main bit line, the first storage array includes a plurality of first sub storage arrays, each of the plurality of first sub storage arrays includes a plurality of first sub bit lines and a plurality of first selector switches, and the plurality of first sub bit lines is electrically connected to the main bit line via the plurality of first selector switches. The method for controlling data storage includes: controlling a given one of the plurality of first selector switches corresponding to a selected one of the plurality of first sub storage arrays to be turned on to electrically connect the plurality of first sub bit lines and the main bit line, and controlling a given one of the plurality of first selector switches corresponding to an unselected one of the plurality of first sub storage arrays to be turned off; and controlling the sense amplifier array to be in an amplification stage to amplify a signal of the main bit line, where a start moment of the amplification stage is later than a start moment of turn-on of the given first selector switch.

The embodiments of the present disclosure may/at least have following advantages.

In the data storage circuit and the control method thereof and the storage apparatus provided in the embodiments of the present disclosure, the first storage array comprises a plurality of first sub storage arrays, each of the plurality of first sub storage arrays comprises a plurality of first sub bit lines and a plurality of first selector switches, each of the plurality of first sub bit lines is electrically connected to the main bit line via a given one of the plurality of first selector switches. The sense amplifier array is electrically connected to the main bit line and is configured to amplify a signal of the main bit line. By controlling the first selector switch corresponding to the selected first sub storage array to be turned on, the first sub bit lines of the first sub storage array are electrically connected to the main bit line via the corresponding first selector switches, such that the sense amplifier array reads and amplifies data of the first sub bit lines of the selected first sub storage array, thereby improving sensitivity of signal sensing and accuracy of data reading. Because the plurality of first sub storage arrays share one sense amplifier array, number of sense amplifiers used is reduced, thereby reducing dimension of space occupied by the sense amplifiers and production costs. Because each of the first storage arrays includes the plurality of first sub storage arrays, on the premise of ensuring that total number of memory cells is not reduced, number of the first storage arrays electrically connected to each main bit line is reduced, and a length of the main bit line BL and a load of its drive are relatively reduced, thereby reducing energy consumption.

In addition, in the embodiments of the present disclosure, the plurality of first sub bit lines are electrically connected to a preset equalization voltage via a first equalizer switch, such that the plurality of first sub bit lines are precharged to the preset equalization voltage via the first equalizer switch to act in cooperation with the sense amplifier, thereby improving the signal sensing sensitivity of the first sub bit line corresponding to the selected first sub storage array. By setting a start moment of turn-off of the first equalizer switch earlier, by first preset time, than a start moment of turn-on of the plurality of first selector switches corresponding to a selected one of the plurality of first sub storage arrays, the first sub bit line corresponding to the unselected first sub storage array is precharged to the preset equalization voltage via the first equalizer switch, and the first sub bit line corresponding to the selected first sub storage array is disconnected from electrical connection to the preset equalization voltage to act in cooperation with the sense amplifier, to read and amplify the signal of the first sub bit line corresponding to the selected first sub storage array, thereby improving the signal sensing sensitivity of the first sub bit line corresponding to the selected first sub storage array. By arranging a second storage array on a side of a sense amplifier array away from the first storage array, the sense amplifier array is electrically connected to the first storage array and the second storage array positioned on two opposite sides thereof. When the sense amplifier array reads and amplifies the signal of the first sub bit line corresponding to the selected first sub storage array, the second storage array provides a reference voltage signal and an equivalent load to the sense amplifier array.

In conclusion, the data storage circuit and the control method thereof, and the storage apparatus provided by the embodiments of the present disclosure can reduce dimension, energy consumption and production costs of a semiconductor storage apparatus without reducing storage capacity of the semiconductor storage apparatus.

Details of one or more embodiments of the present disclosure are set forth in the following drawings and descriptions. Other features, objectives, and advantages of the present disclosure will become apparent from the description, the drawings, and the claims.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 6 is a schematic structural diagram of a storage apparatus provided in an embodiment of the present disclosure; and FIG. 7 is a flowchart of a method for controlling data storage provided in an embodiment of the present disclosure.

DETAILED DESCRIPTION

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. In addition, certain terms used throughout the specification and the following claims refer to particular components. Those skilled in the art will understand that manufacturers may represent components with different names. This document does not intend to distinguish between components with different names but the same functions. In the following description and embodiments, the terms "including" and "comprising" are used in an open-ended fashion, and thus should be interpreted as "including, but not limited to . . . ". Likewise, the term "connection" is intended to express an indirect or direct electrical connection. Correspondingly, if one device is connected to another device, the connection between the two devices may be achieved by means of a direct electrical connection, or by means of an indirect electrical connection of other devices and connectors.

It should be understood that although terms such as "first", "second" and the like may be used herein to describe various components, these components should not be limited by these terms. These terms are only intended to distinguish one component from another one. For example, a first component may be termed a second component, and similarly, a second component may be termed a first component, without departing from the scope of the present disclosure.

Figure 1:
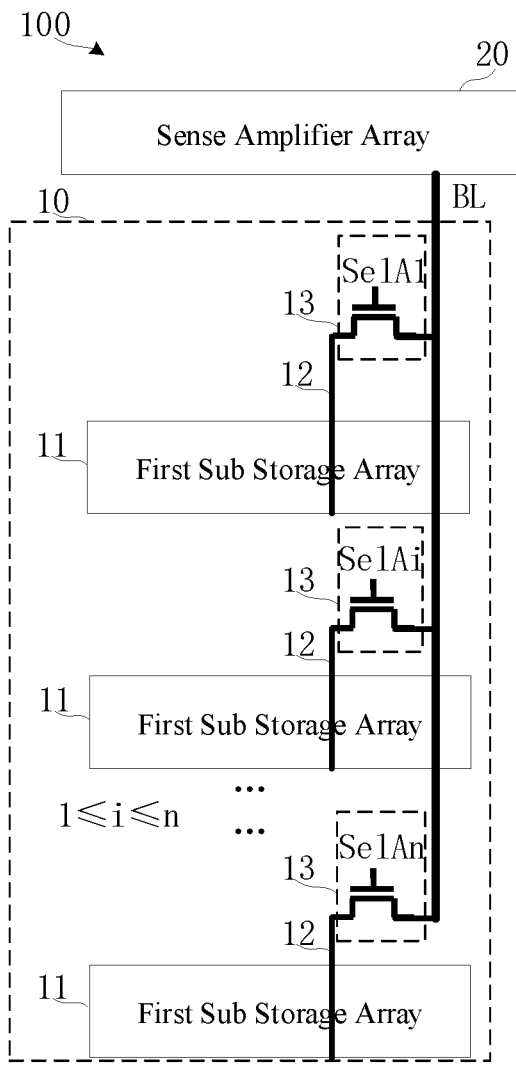
FIG. 1 is a structural block diagram of a data storage circuit provided in an embodiment of the present disclosure.

Referring to FIG. 1, in one embodiment of the present disclosure, a data storage circuit 100 is provided, which includes a first storage array 10 and a sense amplifier array 20, where the first storage array 10 is positioned on a side of the sense amplifier array 20, and the sense amplifier array 20 is electrically connected to a main bit line. The first storage array 10 includes a plurality of first sub storage arrays 11, each of the plurality of first sub storage arrays 11 includes a plurality of first sub bit lines 12 and a plurality of first selector switches 13, each of the plurality of first sub bit lines 12 is electrically connected to the main bit line BL via one of the plurality of first selector switches 13, and the sense amplifier array 20 is configured to amplify a signal of the main bit line BL.

As an example, with continued reference to FIG. 1, the first storage array 10 is set to include n first sub storage arrays 11, each of the first sub storage arrays 11 includes a plurality of first sub bit lines 12 and a plurality of first selector switches 13, each of the first sub bit lines 12 is electrically connected to the main bit line BL via a corresponding one of the first selector switches 13, and the sense amplifier array 20 is electrically connected to the main bit line BL and is configured to amplify a signal of the main bit line BL. By controlling the first selector switch 13 corresponding to the selected first sub storage array 11 to be turned on, the first sub bit lines 12 of the first sub storage array 11 are electrically connected to the main bit line BL via the corresponding first selector switches 13, such that the sense amplifier array 20 reads and amplifies data of the first sub bit lines 12 of the selected first sub storage array 11, thereby improving sensitivity of signal sensing and accuracy of data reading. Because the plurality of first sub storage arrays 11 share one sense amplifier array 20, number of sense amplifiers used is reduced, thereby reducing dimension of space occupied by the sense amplifiers and the production costs. Because each of the first storage arrays 10 includes the plurality of first sub storage arrays 11, on the premise of ensuring that total number of memory cells is not reduced, number of first storage arrays 10 electrically connected to each main bit line BL is reduced, and a length of the main bit line BL and a load of its drive are relatively reduced, thereby reducing energy consumption.

As an example, with continued reference to FIG. 1, in one embodiment of the present disclosure, the plurality of first sub storage arrays 11 are arranged at equal intervals along a direction away from the sense amplifier array 20, to reduce the dimension of the first memory array 10. It should be noted that, in other embodiments, the plurality of first sub storage arrays 11 may also be arranged at unequal intervals.

As an example, with continued reference to FIG. 1, in an embodiment of the present disclosure, each of the first sub storage arrays 11 has equal number of first sub bit lines 12, the first selector switches 13 and the first sub bit lines 12 may be arranged in one-to-one correspondence, and each of the first selector switches 13 is set to include transistors SelA. For example, the transistors SelA may be set to include a transistor SelA1, a transistor SelAi, . . . , and a transistor SelAn arranged in sequence along a direction away from the sense amplifier array 20, 1≤i≤n, where i is a positive integer, and n is a positive integer, such that each of the first sub bit lines 12 is electrically connected to the main bit line BL via the corresponding transistor SelAi, to read and amplify the data of the first sub bit lines 12 of the selected first sub storage array 11, and simplify routing and control of each of the first sub storage arrays 11.

Figure 2:
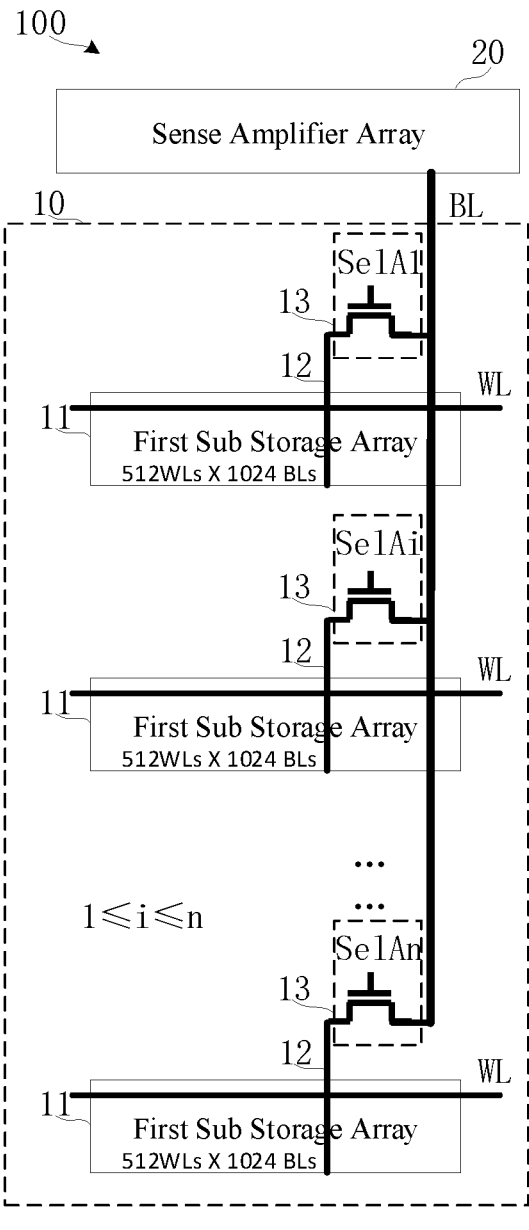
FIG. 2 is a structural block diagram of a data storage circuit provided in another embodiment of the present disclosure.

As an example, referring to FIG. 2, in one embodiment of the present disclosure, each of the plurality of first sub storage arrays 11 includes a plurality of word lines WL, and each of the plurality of first sub storage arrays 11 has equal number of word lines WL, to facilitate routing and control of each of the first sub storage arrays 11. For example, each of the first sub storage arrays 11 includes 512 WLs×1024 BLs. That is, each of the first sub storage arrays 11 includes 512 word lines WL and 1024 bit lines BL. It should be noted that, in other embodiments, the number of word lines WL in each of the first sub storage arrays 11 may also be different.

Figure 3:
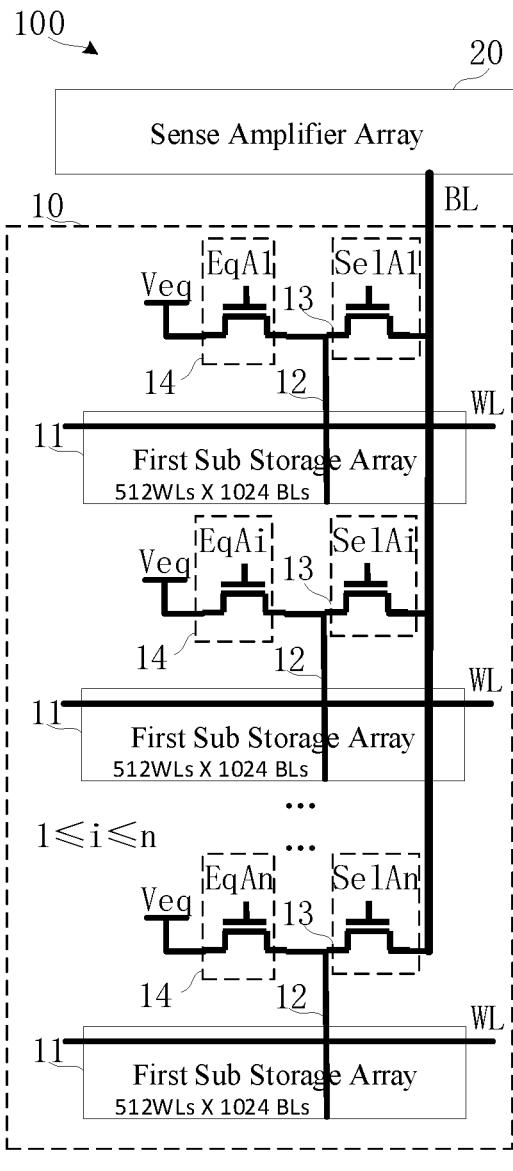
FIG. 3 is a structural block diagram of a data storage circuit provided in yet another embodiment of the present disclosure.

As an example, referring to FIG. 3, in an embodiment of the present disclosure, the first sub bit lines 12 are further electrically connected to a preset equalization voltage Veq via first equalizer switches 14, such that the first sub bit lines 12 are precharged to the preset equalization voltage Veq via the first equalizer switches 14. The first equalizer switches 14 and the first sub bit lines 12 may be arranged in one-to-one correspondence, and each of the first equalizer switches 14 is set to include transistors EqA. For example, the transistors EqA may be set to include a transistor EqA1, a transistor EqAi, . . . , and a transistor EqAn arranged in sequence along the direction away from the sense amplifier array 20, 1≤i≤n, where i is an positive integer, and n is an positive integer, such that each of the first sub bit lines 12 is electrically connected to the preset equalization voltage Veq via the corresponding transistor EqAi, act in cooperation with the sense amplifier, improve signal sensing sensitivity of the first sub bit line 12 corresponding to the selected first sub storage array 11.

As an example, with continued reference to FIG. 3, in an embodiment of the present disclosure, the first equalizer switch 14 is configured to enable a start moment of turn-off earlier, by first preset time, than a start moment of turn-on of the plurality of first selector switches 13 corresponding to a selected one of the plurality of first sub storage arrays 11. The first sub bit line 12 corresponding to the unselected first sub storage array 11 is precharged to the preset equalization voltage via the first equalizer switch 14, and the first sub bit line 12 corresponding to the selected first sub storage array 11 is disconnected from the electrical connection to the preset equalization voltage Veq to act in cooperation with the sense amplifier, to read and amplify the signal of the first sub bit line 12 corresponding to the selected first sub storage array 11, thereby improving the signal sensing sensitivity of the first sub bit line 12 corresponding to the selected first sub storage array 11.

In some embodiments, an operating state of each of the sense amplifiers in the sense amplifier array 20 mainly includes a precharge stage PCG, a charge sharing stage CS, an amplification stage Sensing, and a write-back stage Write Recovery for writing information into the memory cell. The sense amplifier begins to be charged in the precharge stage PCG, reads the information in the memory cell during the charge sharing stage CS, amplifies the read information during the amplification stage Sensing, and writes the amplified information into the memory cell during the write-back stage Write Recovery. The data storage circuit works in the above-mentioned four stages cyclically in sequence, to perform information read/write operation on the memory cell via a single bit line. Reference may be made to a sensitive amplifier and a storage apparatus in a published patent (CN212303080U) for operating principles of the sense amplifier, and thus their detailed descriptions are omitted herein.

Figure 4:
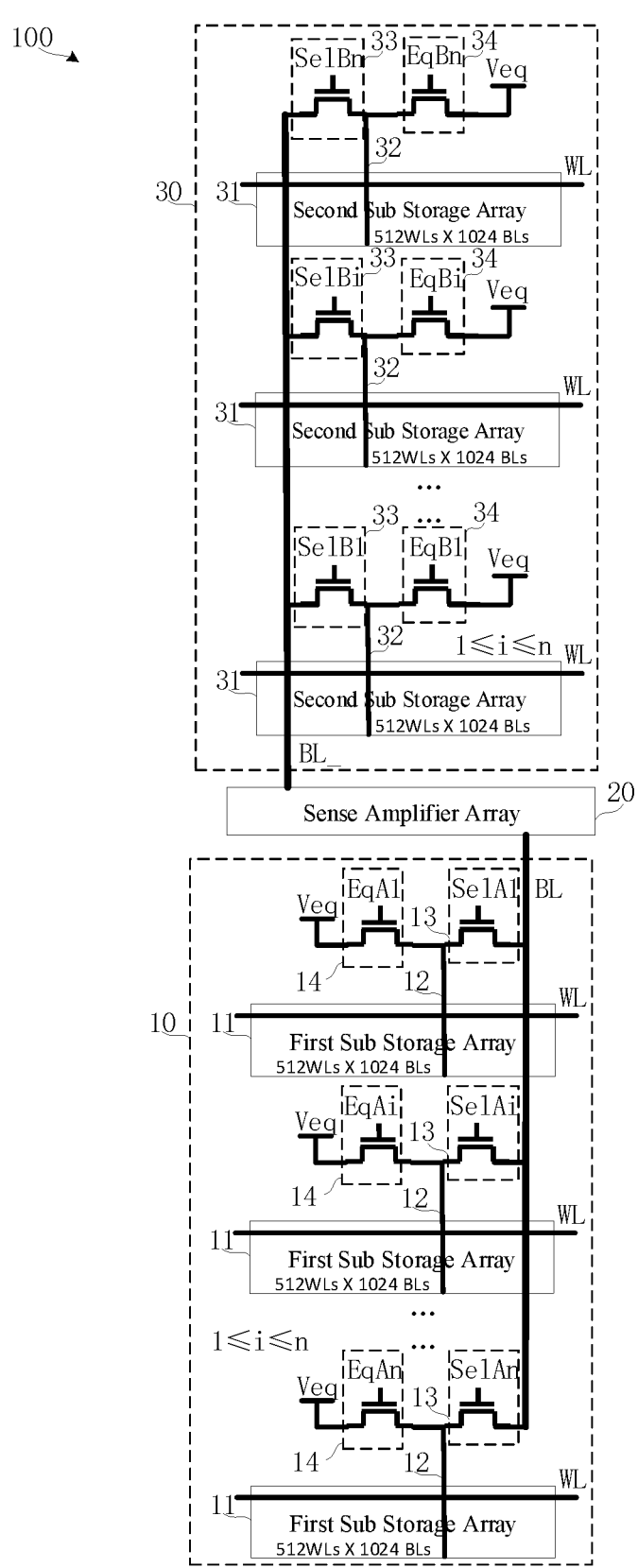
FIG. 4 is a structural block diagram of a data storage circuit provided in still another embodiment of the present disclosure.

As an example, referring to FIG. 4, in one embodiment of the present disclosure, the data storage circuit 100 further includes a second storage array 30, which is positioned on a side of the sense amplifier array 20 away from the first storage array 10, such that the sense amplifier array 20 is electrically connected to the first storage array 10 and the second storage array 30 positioned on two opposite sides thereof. When the sense amplifier array 20 reads and amplifies the signal of the first sub bit line 12 corresponding to the selected first sub storage array 11, the second storage array 30 provides a reference voltage signal to the sense amplifier array 20.

As an example, with continued reference to FIG. 4, in an embodiment of the present disclosure, the second storage array 30 includes a plurality of second sub storage arrays 31, the plurality of second sub storage arrays 31 have equal number as the plurality of first sub storage arrays 11, and each of the plurality of second sub storage arrays 31 includes a plurality of second sub bit lines 32. For example, each of the second sub storage arrays 31 may be set to include 512 WLs×1024 BLs, That is, each of the second sub storage arrays 31 includes 512 word lines WL and 1024 bit lines BL. When the sense amplifier array 20 reads and amplifies a signal of the first sub bit line 12 corresponding to the selected first sub storage array 11, the second sub storage array 31 corresponding to the first sub storage array 11 may be controlled to be electrically connected to the sense amplifier array 20 to match with an input load of the sense amplifier array 20.

As an example, with continued reference to FIG. 4, in one embodiment of the present disclosure, the sense amplifier array 20 is also electrically connected to a complementary main bit line BL_, and the second sub bit line 32 is electrically connected to the complementary main bit line BL_ through the second selector switch 33. The second selector switches 33 and the second sub bit lines 32 may be arranged in one-to-one correspondence, and each of the second selector switches 33 is set to include transistors SelB. For example, the transistors SelB may be set to include a transistor SelB1, a transistor SelBi, . . . , and a transistor SelBn arranged in sequence along the direction away from the sense amplifier array 20, 1≤i≤n, where i is a positive integer, and n is a positive integer, such that each of the second sub bit lines 32 is electrically connected to the complementary main bit line BL_ via the corresponding transistor SelBi. When the sense amplifier array 20 reads and amplifies the signal of the first sub bit line 12 corresponding to the selected first sub storage array 11, the second sub storage array 31 corresponding to the first sub storage array 11 may be controlled to be electrically connected to the complementary main bit line BL_ via the second selector switch 33 to match with the input load of the sense amplifier array 20. Because signals transmitted by the complementary main bit line BL_ and the main bit line BL may be referred to and compared with each other, accuracy of data transmission can be improved.

As an example, with continued reference to FIG. 4, in an embodiment of the present disclosure, the second sub bit lines 32 are further electrically connected to the preset equalization voltage Veq via second equalizer switches 34, such that the second sub bit lines 32 are precharged to the preset equalization voltage Veq via the second equalizer switches 34. The second equalizer switches 34 and the second sub bit lines 32 may be arranged in one-to-one correspondence, and each of the second equalizer switches 34 is set to include transistors EqB. For example, the transistors EqB may be set to include a transistor EqB1, a transistor EqBi, . . . , and a transistor EqBn arranged in sequence along the direction away from the sense amplifier array 20, 1≤i≤n, where i is a positive integer, and n is a positive integer, such that each of the second sub bit lines 32 is electrically connected to the preset equalization voltage Veq via the corresponding transistor EqBi, to act in cooperation with the sense amplifier, thereby improving signal sensing sensitivity of the first sub bit line 12 corresponding to the selected first sub storage array 11, and matching with the input load of the sense amplifier array 20.

As an example, with continued reference to FIG. 4, in an embodiment of the present disclosure, each of the plurality of second sub storage arrays 31 is configured to: when a corresponding one of the plurality of first sub storage arrays 11 is selected, control a corresponding one of the second selector switches 33 to act following a given one of the plurality of first selector switches 13 corresponding to the selected first sub storage array 11; and otherwise, control a given one of the second selector switches 33 corresponding to an unselected one of the plurality of second sub storage arrays 31 to be turned off, to match the input load of the sense amplifier array 20.

As an example, with continued reference to FIG. FIG. 4, in an embodiment of the present disclosure, each of the first storage arrays 10 is configured to: when a corresponding one of the plurality of first sub storage arrays 11 is selected, control a given one of the plurality of first selector switches 13 corresponding to the selected first sub storage array 11 to be turned on to electrically connect the plurality of first sub bit lines 12 and the main bit line; and otherwise, control a given one of the plurality of first selector switches 13 corresponding to an unselected one of the plurality of first sub storage arrays 11 to be turned off, to ensure that the signal of the first sub bit line 12 of the selected first sub storage array 11 to be accurately read, thereby improving accuracy of data transmission.

Figure 5A:
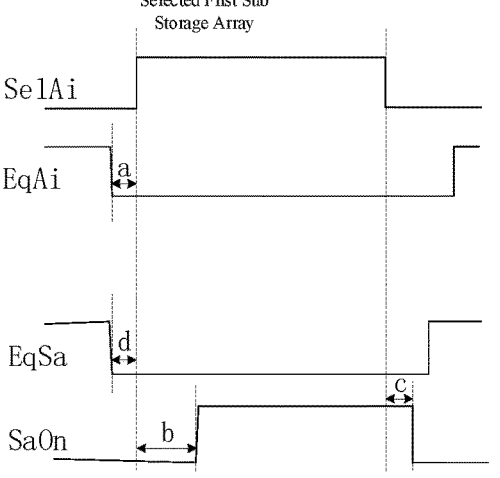
FIGS. 5a to 5b are schematic diagrams showing working time sequences of a data storage circuit in an embodiment of the present disclosure.
Figure 5A:
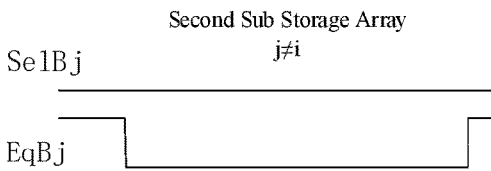
Figure 5B:
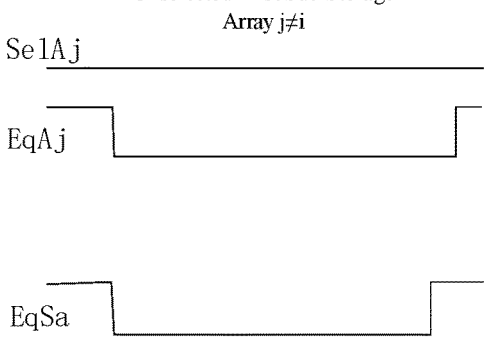

As an example, referring to FIG. 4, FIG. 5a and FIG. 5b, in an embodiment of the present disclosure, EqSa represents a precharge control signal for controlling precharge of the sense amplifier, and SaOn represents an amplification control signal for controlling the sense amplifier to amplify a read signal; SelAi represents an on-off control signal for controlling the transistor SelAi corresponding to the first sub storage array 11 to be turned on or off; and SelBi represents an on-off control signal for controlling the transistor SelBi corresponding to the second sub storage array 31 to be turned on or off. When the first sub storage array 11 is selected and the transistor SelAi is turned on, the corresponding transistor SelBi in the second sub storage array 31 is controlled to be turned on, a transistor SelAj corresponding to the unselected first sub storage array 11 is controlled to be turned off, and a transistor SelBj corresponding to the unselected second sub storage array 31 is controlled to be turned off, $1 \leq i \leq n$, $1 \leq j \leq n$, $i \neq j$, where i and j are both positive integers, and n is a positive integer, such that it is ensured that the signal of the first sub bit lines 12 of the selected first sub storage array 11 is accurately read, the accuracy of data transmission is improved, and the input load of the sense amplifier array 20 is matched.

As an example, with continued reference to FIG. 4, FIG. 5a and FIG. 5b, in an embodiment of the present disclosure, the first equalizer switch 14 is configured to enable a start moment of turn-off earlier, by first preset time a, than a start moment of turn-on of the plurality of first selector switches 13 corresponding to a selected one of the plurality of first sub storage arrays 11, such that the first sub bit line 12 corresponding to the unselected first sub storage array 11 is precharged to the preset equalization voltage via the first equalizer switch 14, and the first sub bit line 12 corresponding to the selected first sub storage array 11 is disconnected from the electrical connection to the preset equalization voltage Veq to act in cooperation with the sense amplifier, to read and amplify the signal of the first sub bit line 12 corresponding to the selected first sub storage array 11, thereby improving the signal sensing sensitivity of the first sub bit line 12 corresponding to the selected first sub storage array 11. The sense amplifier array 20 is configured to: begin to amplify the signal of the main bit line BL within second preset time b from a start moment of turn-on of the first selector switch 13 corresponding to the selected first sub storage array 11, where an end moment of the amplification stage is later, by third preset time c, than the start moment of turn-off of the first selector switch 13 corresponding to the selected first sub storage array 11, to avoid errors in data transmission control due to time delay caused by data amplification by the sense amplifier array 20.

As an example, with continued reference to FIG. 4, FIG. 5a and FIG. 5b, in one embodiment of the present disclosure, the sense amplifier array 20 is configured to: enable an end moment of the precharge stage earlier, by fourth preset time d, than the start moment of turn-on of the given first selector switch 13 corresponding to the selected first sub storage array 11, to control the sense amplifier array 20 to sense and amplify the signal of the first sub bit line 12 corresponding to the selected first sub storage array 11, thereby improving the accuracy of data transmission.

It should be noted that FIG. 5a and FIG. 5b are intended to schematically illustrate an implementation principle of the present disclosure. A time length of first preset time a, a time length of the second preset time b, a time length of the third preset time c, and a time length of the fourth preset time d shown in FIG. 5a may be set according to requirements of application scenarios. For example, the time length of the first preset time a may be set to be equal to the time length of the fourth preset time d.

As an example, referring to FIG. 6, in one embodiment of the present disclosure, a storage device 200 is provided, which includes the data storage circuit 100 described in any one of the embodiments of the present disclosure. By controlling the first selector switch 13 corresponding to the selected first sub storage array 11 to be turned on, the first sub bit lines 12 of the first sub storage array 11 are electrically connected to the main bit line via the corresponding first selector switches 13, such that the sense amplifier array 20 reads and amplifies data of the first sub bit lines 12 of the selected first sub storage array 11, thereby improving sensitivity of signal sensing and accuracy of data reading. Because the plurality of first sub storage arrays 11 share one sense amplifier array 20, number of sense amplifiers used is reduced, thereby reducing dimension of space occupied by the sense amplifiers and the production costs. Because each of the first storage arrays 10 includes the plurality of first sub storage arrays 11, on the premise of ensuring that total number of memory cells is not reduced, number of the first storage arrays 10 electrically connected to each main bit line is reduced, and a length of the main bit line and a load of its drive are relatively reduced, thereby reducing energy consumption.

As an example, with continued reference to FIG. 6, in one embodiment of the present disclosure, a storage device 200 is provided, the data storage circuit 100 includes a first storage array 10, a sense amplifier array 20, and a second storage array 30. The first storage array 10 is positioned on a side of the sense amplifier array 20, and the second storage array 30 is positioned on a side of the sense amplifier array 20 away from the first storage array 10. The first storage array 10 includes a plurality of first sub storage arrays 11, each of the plurality of first sub storage arrays 11 includes a plurality of first sub bit lines 12 and a plurality of first selector switches 13, each of the plurality of first sub bit lines 12 is electrically connected to the main bit line BL via one of the plurality of first selector switches 13. The second storage array 30 includes a plurality of second sub storage arrays 31, the plurality of second sub storage arrays 31 have equal number as the plurality of first sub storage arrays 11, and each of the plurality of second sub storage arrays 31 includes a plurality of second sub bit lines 32. The plurality of second sub bit lines 32 are electrically connected to the complementary main bit line BL_ via second selector switches 33. The sense amplifier array 20 is electrically connected to the main bit line BL and the complementary main bit line BL_. The first selector switches 13 and the first sub bit lines 12 may be arranged in one-to-one correspondence, and each of the first selector switches 13 is set to include transistors SelA. For example, the transistors SelA may be set to include a transistor SelA1, a transistor SelAi, . . . , and a transistor SelAn arranged in sequence along a direction away from the sense amplifier array 20, such that each of the first sub bit lines 12 is electrically connected to the main bit line BL via the corresponding transistor SelAi. The second selector switches 33 and the second sub bit lines 32 may be arranged in one-to-one correspondence, and each of the second selector switches 33 is set to include transistors SelB. For example, the transistors SelB may be set to include a transistor SelB1, a transistor SelBi, . . . , and a transistor SelBn arranged in sequence along the direction away from the sense amplifier array 20, 1≤i≤n, where i is a positive integer, and n is a positive integer, such that each of the second sub bit lines 32 is electrically connected to the complementary main bit line BL_ via the corresponding transistor SelBi. When the first sub storage array 11 is selected and the transistor SelAi is turned on, the corresponding transistor SelBi in the second sub storage array 31 is controlled to be turned on, a transistor SelAj corresponding to the unselected first sub storage array 11 is controlled to be turned off, and a transistor SelBj corresponding to the unselected second sub storage array 31 is controlled to be turned off, 1≤i≤n, 1≤j≤n, i≠j, where i and j are both positive integers, and n is a positive integer, such that it is ensured that the signal of the first sub bit lines 12 of the selected first sub storage array 11 is accurately read, the accuracy of data transmission is improved, and the input load of the sense amplifier array 20 is matched.

As an example, referring to FIG. 7, in an embodiment of the present disclosure, there is provided a method for controlling data storage, which is applied to a data storage circuit, where the data storage circuit comprises a sense amplifier array and a first storage array positioned on a side of the sense amplifier array. The sense amplifier array is electrically connected to the main bit line, the first storage array comprises a plurality of first sub storage arrays, each of the plurality of first sub storage arrays comprises a plurality of first sub bit lines and a plurality of first selector switches, and the plurality of first sub bit lines are electrically connected to the main bit line via the plurality of first selector switches. The method comprises:

Step 202: controlling a given one of the plurality of first selector switches corresponding to a selected one of the plurality of first sub storage arrays to be turned on to electrically connect the plurality of first sub bit lines and the main bit line, and controlling a given one of the plurality of first selector switches corresponding to an unselected one of the plurality of first sub storage arrays to be turned off; and Step 204: controlling the sense amplifier array to be in an amplification stage to amplify a signal of the main bit line, where a start moment of the amplification stage is later than a start moment of turn-on of the given first selector switch.

In some embodiments, by controlling the first selector switch corresponding to the selected first sub storage array to be turned on, the first sub bit lines of the first sub storage array are electrically connected to the main bit line via the corresponding first selector switches, such that the sense amplifier array reads and amplifies data of the first sub bit lines of the selected first sub storage array, thereby improving sensitivity of signal sensing and accuracy of data reading. Because the plurality of first sub storage arrays share one sense amplifier array, number of sense amplifiers used is reduced, thereby reducing dimension of space occupied by the sense amplifiers and production costs. Because each of the first storage arrays includes the plurality of first sub storage arrays, on the premise of ensuring that total number of memory cells is not reduced, number of the first storage arrays electrically connected to each main bit line is reduced, and a length of the main bit line BL and a load of its drive are relatively reduced, thereby reducing energy consumption.

Reference may be made to the limitation of the above data storage circuit for limitation of the method for controlling data storage in the foregoing embodiments, which is not repeated any more herein.

It is to be understood that although the steps in the flowchart of FIG. 7 are sequentially displayed as indicated by the arrows, these steps are not necessarily sequentially performed in the order indicated by the arrows. Unless expressly stated herein, the execution of these steps is not strictly restrictive and may be performed in other order. Moreover, at least a part of the steps in FIG. 7 may include a plurality of steps or a plurality of stages, which are not necessarily performed at the same moment, but may be executed at different moments, and the order of execution of these steps or stages is not necessarily performed sequentially, but may be performed alternately or alternately with at least a part of the steps or stages of other steps or other steps.

Those of ordinary skill in the art may understand that implementation of all or some flows in the method according to the foregoing embodiments may be achieved by instructing relevant hardware by a computer program, wherein the computer program may be stored in a non-transitory computer-readable storage medium, and when the computer program is executed, the flows of the embodiments of the foregoing methods may be included. Any reference to memory, storage, database or other media used in the embodiments provided in the embodiments of the present disclosure may include nonvolatile and/or volatile memory, including but not limited to DRAM, SDRAM, SRAM, DDR SDRAM, DDR2 SDRAM, DDR3 SDRAM, DDR4 SDRAM, LPDDR4 SDRAM, DDR5 SDRAM, LPDDR5 SDRM, GDDR5 SDRAM, GDDR6 SDRAM, PRAM, MRAM, and RRAM.

It is to be noted that the above embodiments are intended for purposes of illustration only and are not intended to limit the present disclosure.

The embodiments in the specification are described in a progressive manner. Each embodiment is focused on difference from other embodiments. And cross reference is available for identical or similar parts among different embodiments.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the patent of the present disclosure shall be merely limited by the appended claims.

What is claimed is:

1. A data storage circuit for DRAM, comprising a first storage array and a sense amplifier array, the first storage array being positioned on a side of the sense amplifier array, a main bit line being electrically connected to the sense amplifier array;

the first storage array comprising a plurality of first sub storage arrays, each of the plurality of first sub storage arrays comprising a plurality of first sub bit lines and a plurality of first selector switches arranged in one-to-one correspondence, each of the plurality of first sub bit lines being electrically connected to the main bit line via a corresponding one of the plurality of first selector switches, and each of the plurality of first sub bit lines is controlled independently of the other first sub bit lines by the corresponding one of the plurality of first selector switches; and the sense amplifier array being configured to amplify a signal of the main bit line; and, wherein each memory cell in the first storage array is configured to be read or written via being electrically connected to a single first sub bit line, a number of the plurality of first sub bit lines in each of the plurality of first sub storage arrays is more than two, and a number of the plurality of first selector switches in each of the plurality of first sub storage arrays is more than two, and wherein the plurality of first sub bit lines are further electrically connected to a preset equalization voltage via a plurality of first equalizer switches, and the plurality of first sub bit lines and the plurality of first equalizer switches are arranged in one-to-one correspondence.

2. The data storage circuit according to claim 1, wherein the plurality of first sub storage arrays are arranged at equal intervals along a direction away from the sense amplifier array.

3. The data storage circuit according to claim 2, wherein each of the plurality of first sub storage arrays has equal number of first sub bit lines.

4. The data storage circuit according to claim 1, wherein each of the plurality of first sub storage arrays comprises a plurality of word lines, each of the plurality of first sub storage arrays having equal number of word lines.

5. The data storage circuit according to claim 1, wherein each of the plurality of first equalizer switches is configured to:

enable a start moment of turn-off earlier, by first preset time, than a start moment of turn-on of the plurality of first selector switches corresponding to a selected one of the plurality of first sub storage arrays.

6. The data storage circuit according to claim 5, wherein a first sub bit line corresponding to an unselected first sub storage array is precharged to the preset equalization voltage via a corresponding one of the plurality of first equalizer switches, and a first sub bit line corresponding to the selected one of the plurality of first sub storage arrays is disconnected from the preset equalization voltage to act in cooperation with the sense amplifier array.

7. The data storage circuit according to claim 1, further comprising a second storage array, the second storage array being positioned on a side of the sense amplifier array away from the first storage array.

8. The data storage circuit according to claim 7, wherein the second storage array comprises a plurality of second sub storage arrays, the plurality of second sub storage arrays having equal number as the plurality of first sub storage arrays, and each of the plurality of second sub storage arrays comprising a plurality of second sub bit lines.

9. The data storage circuit according to claim 8, wherein the sense amplifier array is further electrically connected to a complementary main bit line, the plurality of second sub bit lines being electrically connected to the complementary main bit line via second selector switches.

10. The data storage circuit according to claim 9, wherein each of the plurality of second sub storage arrays is configured to:

when a corresponding one of the plurality of first sub storage arrays is selected, control a corresponding one of the second selector switches to act following a given one of the plurality of first selector switches corresponding to the selected first sub storage array; and otherwise, control a given one of the second selector switches corresponding to an unselected one of the plurality of second sub storage arrays to be turned off.

11. The data storage circuit according to claim 1, wherein the first storage array is configured to:

when a corresponding one of the plurality of first sub storage arrays is selected, control a given one of the plurality of first selector switches corresponding to the selected first sub storage array to be turned on to electrically connect a corresponding one of the plurality of first sub bit lines and the main bit line, wherein the sense amplifier array is further configured to amplify a signal of the corresponding one of the plurality of first sub bit lines connected to the main bit line; and otherwise, control a given one of the plurality of first selector switches corresponding to an unselected one of the plurality of first sub storage arrays to be turned off.

12. The data storage circuit according to claim 11, wherein the sense amplifier array is configured to:

begin to amplify the signal of the main bit line within second preset time from a start moment of turn-on of the given first selector switch corresponding to the selected first sub storage array, wherein an end moment of an amplification stage is later, by third preset time, than a start moment of turn-off of the given first selector switch corresponding to the selected first sub storage array.

13. The data storage circuit according to claim 12, wherein the sense amplifier array is configured to:

enable an end moment of a precharge stage earlier, by fourth preset time, than the start moment of turn-on of the given first selector switch corresponding to the selected first sub storage array.

14. A storage apparatus, comprising:

a plurality of data storage circuits according to claim 1.

15. The data storage circuit according to claim 1, wherein each first sub bit line is electrically connected to a preset equalization voltage via the corresponding first equalizer switch.

16. The data storage circuit according to claim 1, wherein each first sub bit line is directly connected to each first equalizer switch.

17. A method for controlling data storage, applied to a data storage circuit for DRAM, the data storage circuit comprising a sense amplifier array and a first storage array positioned on a side of the sense amplifier array, a main bit line being electrically connected to the sense amplifier array, the first storage array comprising a plurality of first sub storage arrays, each of the plurality of first sub storage arrays comprising a plurality of first sub bit lines and a plurality of first selector switches arranged in one-to-one correspondence, each of the plurality of first sub bit lines being electrically connected to the main bit line via a corresponding one of the plurality of first selector switches, and each of the plurality of first sub bit lines is controlled independently of the other first sub bit lines by the corresponding one of the plurality of first selector switches, wherein each memory cell in the first storage array is configured to be read or written via being electrically connected to a single first sub bit line, a number of the plurality of first sub bit lines in each of the plurality of first sub storage arrays is more than two, and a number of the plurality of first selector switches in each of the plurality of first sub storage arrays is more than two, and wherein the plurality of first sub bit lines are further electrically connected to a preset equalization voltage via a plurality of first equalizer switches, and the plurality of first sub bit lines and the plurality of first equalizer switches are arranged in one-to-one correspondence, the method comprising:

controlling a given one of the plurality of first selector switches corresponding to a selected one of the plurality of first sub storage arrays to be turned on to electrically connect a corresponding one of the plurality of first sub bit lines and the main bit line, and controlling a given one of the plurality of first selector switches corresponding to an unselected one of the plurality of first sub storage arrays to be turned off; and controlling the sense amplifier array to be in an amplification stage to amplify a signal of the main bit line, wherein a start moment of the amplification stage is later than a start moment of turn-on of the given first selector switch.

18. The method according to claim 17, wherein the plurality of first sub bit lines and the plurality of first selector switches are arranged in one-to-one correspondence, and the sense amplifier array is further configured to amplify a signal of the corresponding one of the plurality of first sub bit lines connected to the main bit line.

* * * * *